United States Patent
Durand et al.

(10) Patent No.: US 11,243,240 B2
(45) Date of Patent: Feb. 8, 2022

(54) METHOD AND SYSTEM FOR THE TESTING OF AN ANTENNA COMPRISING A PLURALITY OF RADIATING ELEMENTS

(71) Applicant: MVG Industries, Villejust (FR)

(72) Inventors: Ludovic Durand, Leuville sur Orge (FR); Luc Duchesne, Angervilliers (FR); Nicolas Gross, Gif S/Yvette (FR)

(73) Assignee: MVG Industries

( * ) Notice: Subject to any disclaimer, the term of this patent is extended or adjusted under 35 U.S.C. 154(b) by 205 days.

(21) Appl. No.: 16/494,064

(22) PCT Filed: Mar. 16, 2017

(86) PCT No.: PCT/IB2017/000441
§ 371 (c)(1),
(2) Date: Sep. 13, 2019

(87) PCT Pub. No.: WO2018/167529
PCT Pub. Date: Sep. 20, 2018

(65) Prior Publication Data
US 2020/0124651 A1    Apr. 23, 2020

(51) Int. Cl.
*H01Q 3/26* (2006.01)
*G01R 29/10* (2006.01)

(52) U.S. Cl.
CPC ............ *G01R 29/10* (2013.01); *H01Q 3/267* (2013.01)

(58) Field of Classification Search
CPC .................. G01R 29/10; H01Q 3/267

USPC .......................................................... 343/703
See application file for complete search history.

(56) References Cited

U.S. PATENT DOCUMENTS

| | | | |
|---|---|---|---|
| 9,041,610 B1 | 5/2015 | Henrie | |
| 2002/0140600 A1* | 10/2002 | Utley | ............. H01Q 3/267 342/360 |
| 2014/0105204 A1* | 4/2014 | Bengtsson | .......... H04B 7/0814 370/345 |
| 2016/0043778 A1* | 2/2016 | Sikina | .................... G01D 18/00 455/41.1 |

OTHER PUBLICATIONS

Hanfling, et al., "The Backward Transform of the Near Field for Reconstruction of Aperture Fields", AP/B Poster B—Jun. 5, 1979, pp. 764-767.

(Continued)

*Primary Examiner* — Andrea Lindgren Baltzell
(74) *Attorney, Agent, or Firm* — Lerner, David, Littenberg, Krumholz & Mentlik, LLP

(57) ABSTRACT

The invention relates to a method and system for the testing of an antenna comprising a plurality of radiating elements, wherein an array of one or more probes is placed in front of the antenna to be tested, and wherein the following steps are performed: acquisition by the array of one or more probes or by the radiating elements of the antenna under test of an RF signal emitted by the antenna under test or by the array of one or more probe (s), back propagation reconstruction of the signal emitted through a computation of the signal received by the various probes of the array of one or more probes or by the radiating elements of the antenna under test, test of the signal thus reconstructed or of parameters thereof to detect a potential defect of the antenna.

10 Claims, 4 Drawing Sheets

(56) References Cited

OTHER PUBLICATIONS

Hu, et al. "A Near-Field Diagnostic Technique Based On Equivalent Magnetic Currents", Key Lab. for Antennas and Microwave Technology, Xidian University, Xi'an, Aug. 2000, pp. 508-511.
International Search Report from Application No. PCT/IB2017/000441 dated Dec. 1, 2017, pp. 1-2.

* cited by examiner

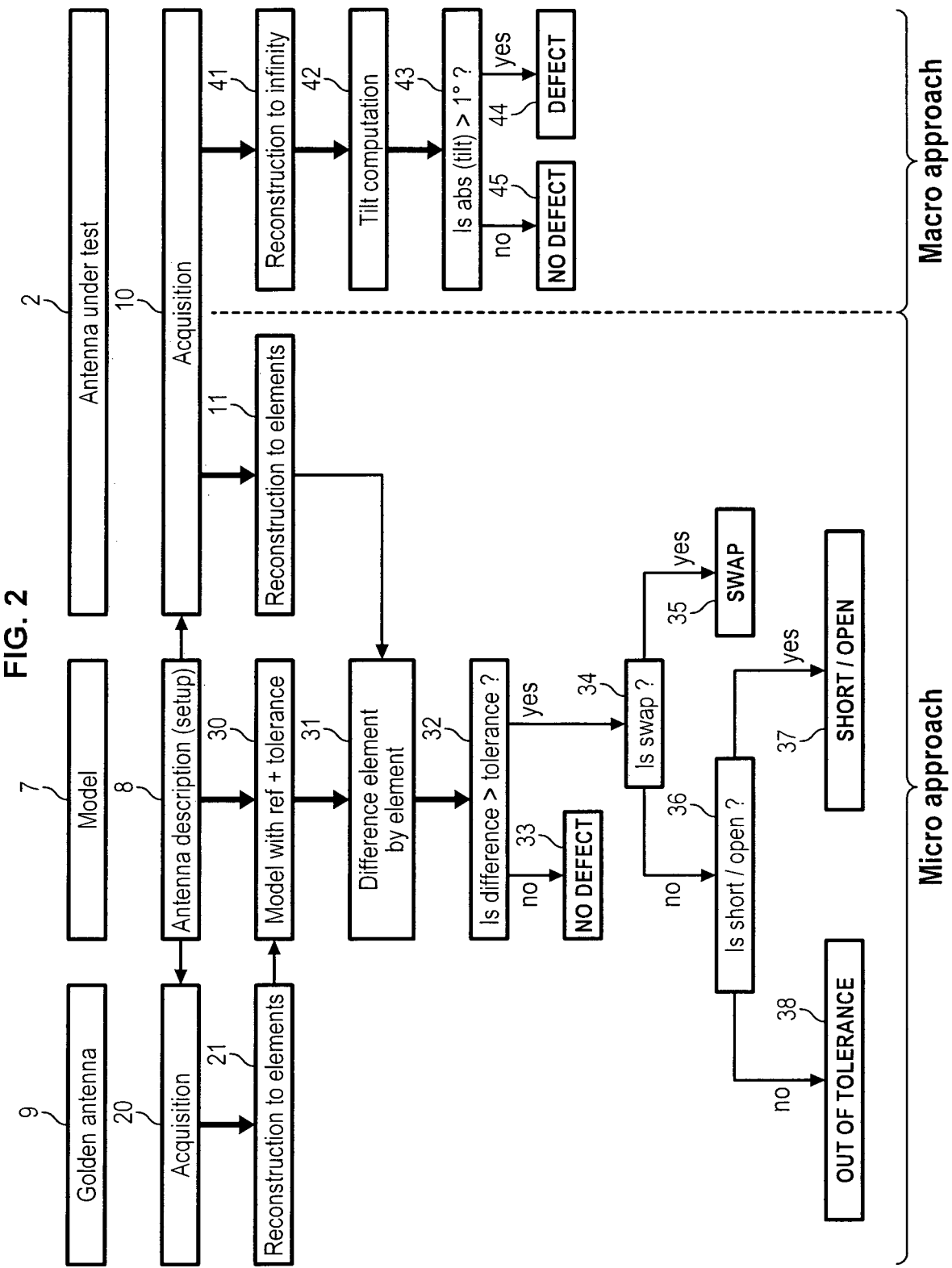

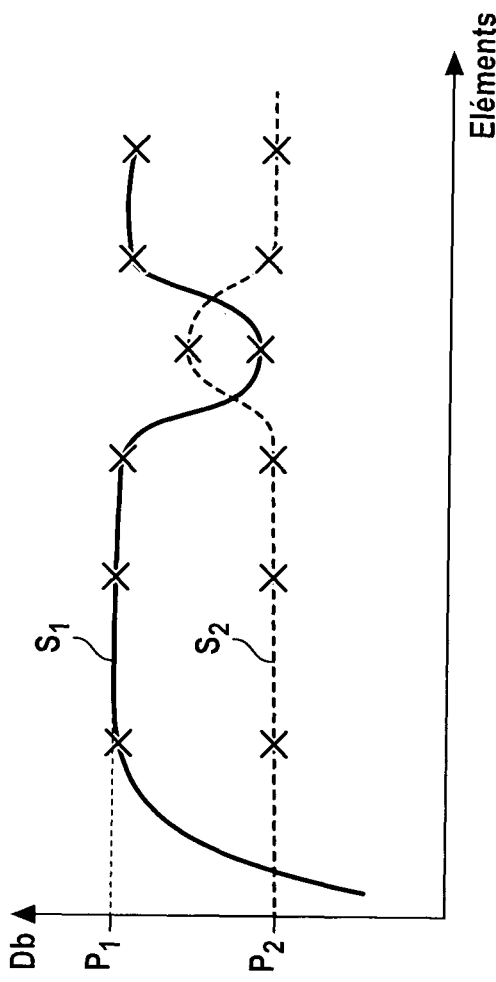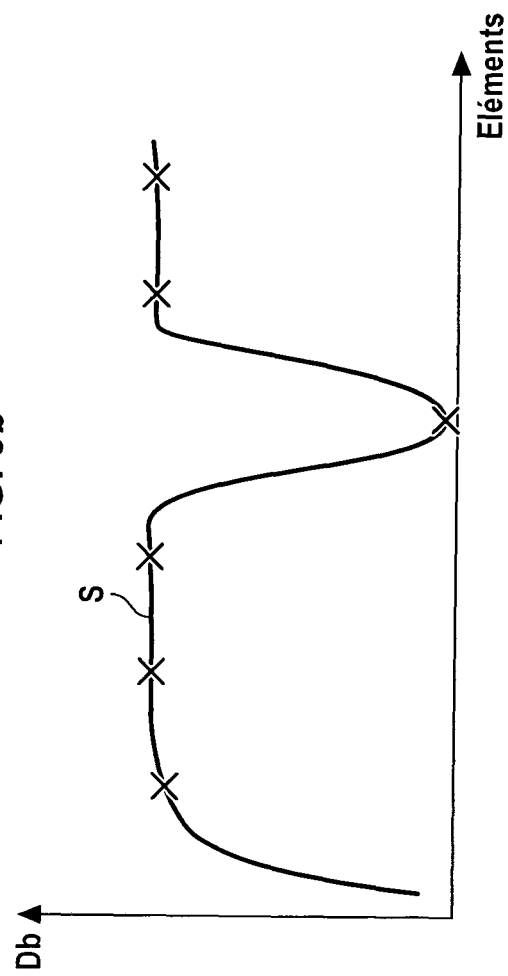

METHOD AND SYSTEM FOR THE TESTING OF AN ANTENNA COMPRISING A PLURALITY OF RADIATING ELEMENTS

CROSS-REFERENCE TO RELATED APPLICATIONS

The present application is a national phase entry under 35 U.S.C § 371 of International Application No. PCT/IB2017/000441 filed Mar. 16, 2017, all of which is hereby incorporated herein by reference.

GENERAL TECHNICAL FIELD

The invention relates to the testing of antennas during their manufacturing.

More particularly, it proposes a testing method and a testing system for the test of antennas in production.

The testing method and system proposed are of particular interest in the case of array antennas such as base station antennas (BTS). BTS are formed of several array antennas (several ports).

STATE OF THE ART

Array antennas are usually formed of a plurality of radiating elements which are linked via cables to an electrical circuit controlling said radiating elements in phase and magnitude.

Those cables can be soldered manually to the radiating elements and defects can exist such as:
Bad soldering (resulting in a short circuit);
No soldering (resulting in an open circuit);
Wrong position soldering (resulting in a swap between two elements, such as between two elements corresponding to two different polarisations).

Base stations and array antennas being more and more complex, there is a need to reduce the time spent in their testing, as well as to reduce the rate of scraps.

Production testers are commonly used to perform phase-magnitude tests during productions. Usually, a single probe or an array of one or more probes is moved around the antenna to measure the signal transmitted. Such testers can detect that an antenna is not working properly but give no indication as to where the problems come from within the antennas and the nature of the defects. Further, those testers are very time-consuming.

PRESENTATION OF THE INVENTION

Therefore, the invention is aimed at further improving testers for antennas.

To this end, a method is disclosed for the testing of an antenna comprising a plurality of radiating elements, wherein an array of one or more probes is placed in front of the antenna to be tested, and wherein the following steps are performed:
acquisition by each probe of the array of one or more probes of an RF signal emitted by the antenna under test or acquisition by the antenna under test of an RF signal emitted by each probe of the array of one or more probes,
back propagation reconstruction of the signal(s) received or emitted by each probe of the array of one or more probes through a computation of the signal(s) received or emitted by the various probes of the array of one or more probes,
test of the signal thus reconstructed or of parameters thereof to detect a potential defect of the antenna.

The backpropagation reconstruction can be a reconstruction to infinity and wherein the signal thus reconstructed is computed to determine a tilt angle, a beamwidth and side lobe levels, said tilt angle, beamwidth and side lobe levels being tested to detect a potential defect of the antenna.

In complement or as an alternative, the backpropagation reconstruction reconstructs the signal over a surface close or coinciding with the radiating elements of the tested antenna and wherein the method further performs the following step:
comparison of the magnitude and/or phase of the signal thus reconstructed for each of the radiating elements of the antenna under test with the magnitude and/or phase of the signal reconstructed for the corresponding radiating elements of a golden antenna or of an average of several golden antennas used as a reference, the result of this comparison being used to decide a defect detection.

Such a testing method has the advantage of not being time-consuming. It provides information as to which radiating element of the antenna has a defect and permits a diagnostic of the type of defect.

Such a method is further potentially complemented by the following features taken alone or in combination:
a defect is detected for a given radiating element of the antenna under test where the magnitude and/or phase of the signal reconstructed for the corresponding element of the golden antenna and for said radiating element of the antenna under test differ beyond predetermined tolerance frame;
if a defect is detected, it is tested whether or not two radiating elements corresponding to two perpendicular polarizations have been swapped;
the magnitude of the signal reconstructed for said radiating elements are compared and the result of this comparison is used to detect whether these two radiating elements have been swapped;
if it is detected for a given radiating element of the antenna under test that no swap took place, a test is further performed to detect whether or not said radiating element is in short/open circuit;
the detection as to whether or not said radiating element is in short/open circuit comprises a testing on the level of the magnitude of the reconstructed signal.

The invention also proposes a testing system for the testing of an antenna comprising a plurality of radiating elements, said system comprising an array of one or more probes placed in front of the antenna to be tested, and further comprising a vector network analyser or any instrumentations capable of measuring magnitude and phase of the signals, controlled by a computer and running the various steps of the method described above.

The array of one or more probes can be linear or the probes of the array of one or more probes can be distributed on a surface.

DESCRIPTION OF THE FIGURES

Other characteristics, purposes and advantages of the invention will become clear from the following description, which is purely illustrative and is non-limitative, and which must be read with reference to the appended drawings in which:

FIG. 2 illustrates various steps of the testing performed by such a tester, FIGS. 3a and 3b are graphs illustrating the detection of a swap or of a short/open circuit within one radiating element of an antenna.

DETAILED DESCRIPTION OF THE INVENTION

Testing Device

Figure 1A:
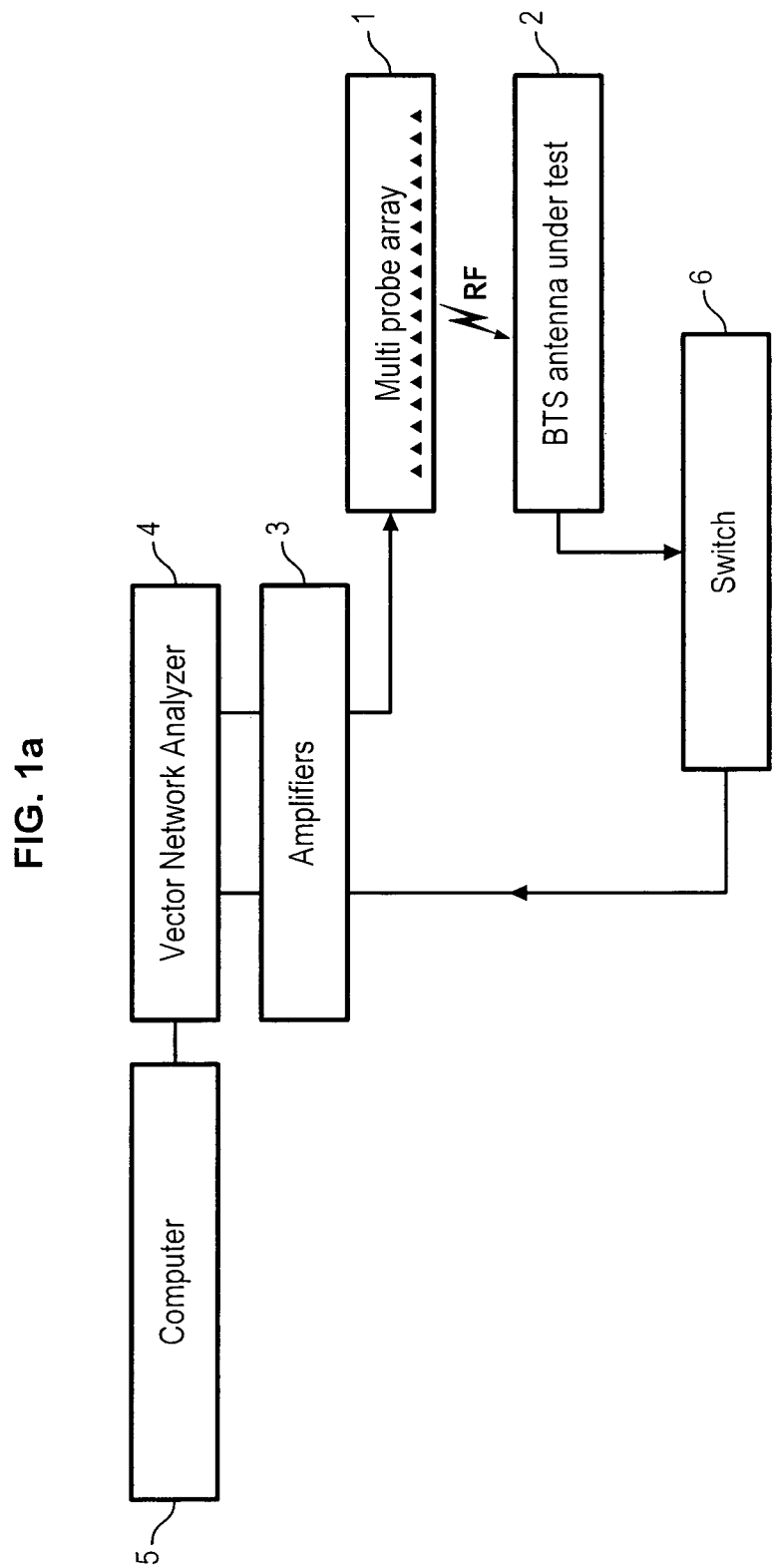
FIG. 1a and FIG. 1b illustrate possible embodiments of an antenna tester according to the invention, respectively for reception mode and for transmission mode.
Figure 1B:
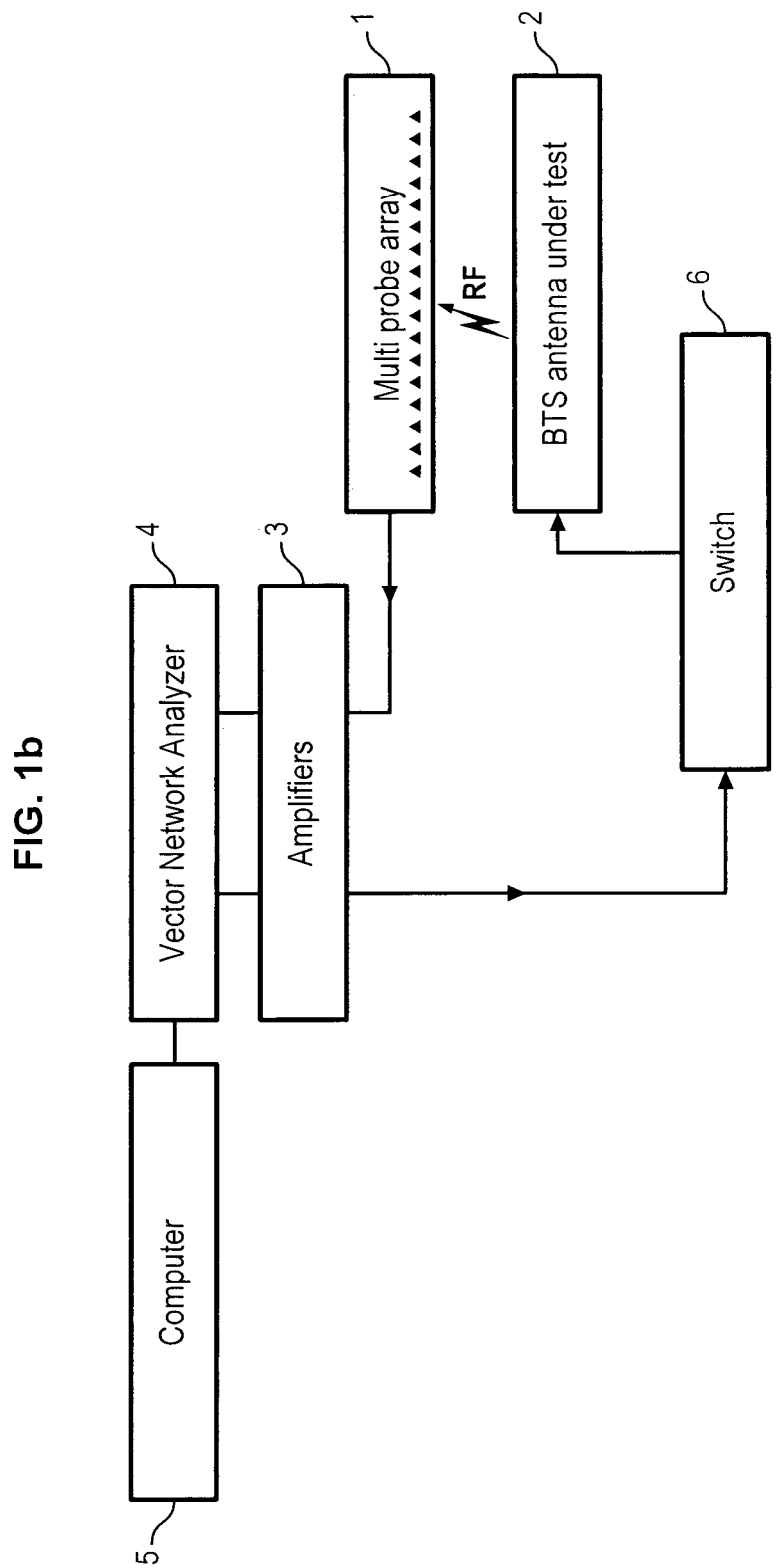

The testing device illustrated on FIGS. 1a and 1b comprises an array 1 of one or more probes which is placed in front of the antenna 2 to be tested.

Said array 1 is linked via amplifiers 3 to a VNA 4 (Vector Network Analyser) which communicates with a computer 5. The amplifiers 3 are optional.

Said VNA 4 is also linked via amplifiers 3 and via various switches 6 to the various ports of the antenna under test 2.

The probes of the array 1 can be located linearly (for example along a line parallel to the antenna 2) or on a surface.

The VNA 4 transmits and receives the RF signals.

The amplifiers 3 allow to amplify the signal emitted and received by the VNA 4.

The switches 6 allow to test individually the various ports of antenna 2. The switches 6 are optional and the connection to each port of antenna 2 can be done manually.

Testing Procedure
Acquisition (Step 10)
Receive Mode

A given port of antenna 2 can be tested as to its receive mode as follows.

The VNA 4 (controlled by computer 5) transmits to each probe of array 1 an RF signal which is received by antenna 2 under test.

This signal is received by the radiating elements of the given port of antenna 2 and combined to be transferred to the switches 6 and to the VNA 4 via the amplifiers 3.

A comparison between the signals sent and the signals received is thus performed to measure the transmission coefficients at each measured sample location corresponding to the location of each probe of array 1.

Thanks to the switches 6, this test is repeated for each of the ports of the antenna under test.

Transmit Mode

The VNA 4 transmits an RF signal to a given port of antenna 2 under test. This signal is thus emitted simultaneously by the various radiating elements of the given port of antenna 2 that has been selected through switches 6.

The combined signal emitted by antenna 2 is received by each probe of array 1 and sent from each probe of array 1 to the VNA 4 via the amplifiers.

A comparison between the signals sent and the signals received is thus performed to measure the transmission coefficients at each measured sample location corresponding to the location of each probe of array 1.

Thanks to the switches 6, this test is repeated for each of the ports of the antenna under test.

Reconstruction (Steps 11 or 41)

The signal measured (in receive mode or transmit mode) at each sample location by the probes of the array 1 of one or more probes is then used by computer 5 to virtually perform a back propagation and reconstruct the signal (magnitude and phase).

The reconstruction is performed through classical back-scattering reconstruction techniques such as described in the following articles:

Hu Hongfei, Fu Demin—A Near-Field Diagnostic Technique Based on Equivalent Magnetic Currents—IEEE 2000—p. 508-511;

J. D. Hanfling, G. V. Borgiotti, L. Kaplan—The backward transform of the near field for reconstruction of aperture fields—IEEE—1979—p. 764-767.

Macro Approach

In a first implementation, the reconstruction performed is a reconstruction to infinity (step 41).

With this reconstruction, computer 5 determines a corresponding tilt angle, beamwidth, side lobe levels (step 42).

The tilt angle, beamwidth, side lobe levels thus computed are tested (step 43).

In the case of the tilt angle, the test can be a comparison with a threshold of deviation angle with respect to a nominal angle, for example said chosen deviation angle is equal to 1°.

In the case of the beamwidth, the test can be a comparison with a threshold of deviation angle with respect to a nominal beamwidth, for example said chosen deviation angle is equal to 0.5°.

In the case of the side lobe levels, the test can be a comparison with a threshold of deviation magnitude with respect to a maximum magnitude, for example said chosen deviation magnitude is equal to 2 dB.

Should the deviation of the tilt angle, of the beamwidth or of the side lobe levels be greater than said threshold of deviation angle or magnitude, it is considered that a defect is detected (output 44).

If not, it is considered that no defect is detected (output 45).

Micro Approach

In a second implementation, which can be performed as a complement to the macro approach or independently, the reconstruction is performed over a surface close or coinciding with the radiating elements of tested antenna (step 11).

It will be here noted that to allow such a reconstruction, the spatial sampling of the probes of array 1 is chosen to respect the Nyquist-Shannon sampling criterion.

A geometrical model 7 and a description 8 of the antenna are used as inputs for the reconstruction. The inputs can be for instance the element geometrical location and the operating frequency points.

Comparison with Golden Antenna (9)

The phase/magnitude then reconstructed at the surface close to each radiating element of antenna 2 are then processed element per element in order to detect which element(s) of the antenna has(ve) a defect and the kind of defect which is at stake.

To this end, a golden antenna 9 or an average of a plurality of golden antennas is used as reference for comparison. The acquisition and reconstruction steps are performed for each radiating element both for the golden antenna and for the antenna 2 under test (steps 20 and 21 for the golden antenna and steps 10 and 11 for the tested antenna 2).

The reconstructed magnitude and/or phase are compared for each radiating element that are in correspondence over the two antennas 2, 9 (step 31).

A model taking into account a tolerance frame is to this end provided as input to computer 5 (model 30 with tolerance).

Where a magnitude and/or phase difference is detected between one radiating element of the golden antenna 9 and the corresponding radiating element of the antenna under test 2, it is tested whether this difference is within the tolerance frame accepted for the manufactured antennas (step 32).

If it is the case, it is considered that no difference exists (step 33).

Test of Swap (test 34)

If the difference is beyond the tolerance frame, it is checked whether or not such a difference could be due to a swap, such as a swap between two radiating elements corresponding to two perpendicular polarizations.

In such a case, contrary to the results for the other radiating elements having no swap, the magnitude of the signal S1 reconstructed at the radiating element considered would be above the magnitude of the signal S2 reconstructed at the radiating element of perpendicular polarization (FIG. 3*a*).

If this is confirmed, the defect has been found and can thus be treated on the antenna (step 35).

Test of Short/Open Circuit (Test 36)

If it is not the case, it is checked whether or not the magnitude of the signal S reconstructed at the radiating element is null or close to zero, in which case it will be considered that the cables soldered to the given element is in short or open circuit (see FIG. 3*b*).

If it is the case, the defect is thus detected and located, and is treated (step 37).

If not, it is considered that the radiating element considered is out of tolerance (step 38).

The invention claimed is:

1. Method for the testing of an antenna comprising a plurality of radiating elements, wherein an array of one or more probe(s) is placed in front of the antenna to be tested, and wherein the following steps are performed:
    acquisition by each probe of the array of one or more probes of an RF signal emitted by the antenna under test or acquisition by the antenna under test of an RF signal emitted by each probe of the array of one or more probes,
    back propagation reconstruction of the signal received or emitted by each probe of the array of one or more probes through a computation of the signal received or emitted by the various probes of the array of one or more probes,
    test of the signal thus reconstructed or of parameters thereof to detect a potential defect of the antenna,
    wherein the backpropagation reconstruction reconstructs the signal over a surface close or coinciding with the radiating elements of the tested antenna and wherein the method further performs the following step:
    comparison of the magnitude and/or phase of the signal thus reconstructed for each of the radiating elements of the antenna under test and the magnitude and/or phase of the signal reconstructed for corresponding radiating elements of a golden antenna used as a reference, the result of this comparison being used to decide a defect detection.

2. Method according to claim 1, wherein a defect is detected for a given radiating element of the antenna under test where the magnitude and/or phase of the signal reconstructed for the corresponding element of the golden antenna and for said radiating element of the antenna under test differ beyond predetermined tolerance frame.

3. Method according to claim 2, wherein, when a defect is detected, it is tested whether or not two radiating elements corresponding to two perpendicular polarizations have been swapped.

4. Method according to claim 3, wherein the magnitude of the signal reconstructed for said radiating elements are compared and the result of this comparison is used to detect whether these two radiating elements have been swapped.

5. Method according to claim 4, wherein, when it is detected for a given radiating element of the antenna under test that no swap took place, a test is further performed to detect whether or not said radiating element is in short/open circuit.

6. Method according to claim 5, wherein the detection as to whether or not said radiating element is in short/open circuit comprises a testing on the level of the magnitude of the reconstructed signal.

7. Method according to claim 1, wherein the following tests are performed:
    Transmission by the array of one or more probe(s) of a given RF signal to be received by the antenna under test;
    Reception of said RF signal by each of the radiating elements of the given port;
    Combination and transfer of the signals received by said radiating elements to an analyser;
    For each of the ports of the antenna under test, processing the signal sent and the signal received to measure the transmission coefficients for each probe of the array.

8. Testing system for the testing of an antenna comprising a plurality of radiating elements, said system comprising an array or one or more probe(s) placed in front of the antenna to be tested, and further comprising a vector network analyser or any instrumentation capable of measuring magnitude and phase, controlled by a computer, said analyser and/or computer being programmed to run the various steps of the method according to claim 1.

9. Testing system according to claim 8, wherein the array is a linear array of probes.

10. Testing system according to claim 8, wherein the array comprises a plurality of probes distributed on a surface.

* * * * *